Figure 1:
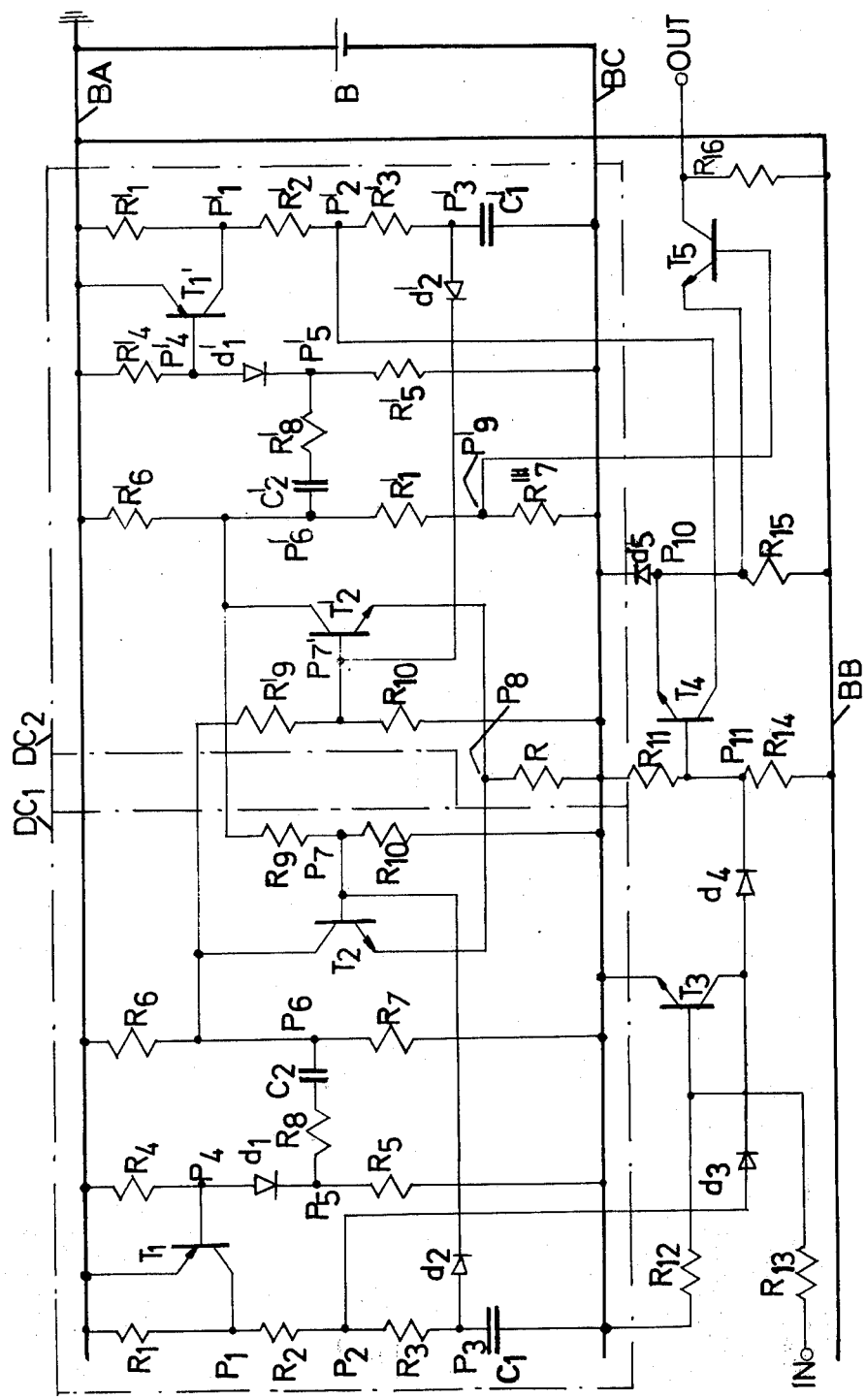

United States Patent [19]

Venken

[11] 3,991,324
[45] Nov. 9, 1976

[54] DIAL PULSE DETECTOR

[75] Inventor: Jan Hubert Ghislaan Venken, Schilde-Belgie, Belgium

[73] Assignee: International Standard Electric Corporation, New York, N.Y.

[22] Filed: Apr. 22, 1975

[21] Appl. No.: 570,401

[30] Foreign Application Priority Data
May 14, 1974 Belgium .................................. 06433

[52] U.S. Cl. .............................. 307/265; 307/234; 307/268; 328/164
[51] Int. Cl.² ........................................ H03K 1/18
[58] Field of Search .......... 307/232, 233, 234, 265, 307/268, 273, 274; 328/111, 112, 164, 58; 178/70 R, 70 T; 325/13

[56] References Cited
UNITED STATES PATENTS

| | | | |
|---|---|---|---|
| 3,317,668 | 5/1967 | Johnsen | 307/273 |
| 3,317,843 | 5/1967 | Emmons | 307/273 |

*Primary Examiner*—John Zazworsky
*Assistant Examiner*—Marcus S. Rasco
*Attorney, Agent, or Firm*—J. B. Raden; M. M. Chaben

[57] ABSTRACT

A two-level signalling or pulse correcting circuit which includes two delay circuits each feeding a section of a bistate output device. Each delay circuit has an individual time modifier circuit responsive to an input pulse duration of greater than a predetermined minimum for increasing the duration of an output pulse from said device to an interval between said minimum duration and a predetermined maximum duration.

10 Claims, 4 Drawing Figures

DIAL PULSE DETECTOR

The present invention relates to a two-level signalling circuit including a first and a second delay circuit able to react to positive and negative input level changes of two-level input pulses respectively and a bistate circuit coupled to said first and second delay circuits, said first and second delay circuits causing the triggering of said bistate circuit to a first and a second state respectively only if the corresponding new level at least has a first duration.

Such a two-level signalling circuit is already known from U.S. Pat. No. 3,891,808 issued June 24, 1975 (M. Van Brussel-R. Polle 3-1). With this circuit input pulses and more paticularly telephone dial pulses of a duration smaller than a first or minimum duration of 10 milliseconds are prevented from appearing at the output of the circuit; while input pulses having a duration at least equal to a second duration of 16 milliseconds appear unmodified at this output. However, input pulses having a duration comprised between 10 and 16 milliseconds may be transformed into output pulses having a duration smaller than the first duration thus defeating the purpose of the circuit which is to prevent such pulses from appearing at the output of the circuit.

An object of the present invention is therefore to provide a two-level signalling circuit of the above type wherein input pulses at least equal to a first duration always appear at the output of the curcuit as output pulses having at least a second duration larger than the first, so that the output pulses may be securely detected by scanning this output with a periodicity slightly smaller than said second duration.

According to the present invention this is achieved due to the fact that said bistate circuit is coupled to a first and a second control circuit which are coupled to said first and second delay circuits respectively and which are able to modify the time delay of said first and second delay circuit upon said bistate circuit having been triggered to said second and first state respectively.

Another characteristic feature of the present signalling circuit is that the normal delay of each of said delay circuits is substantially at least equal to said first duration and that each of said first and second control circuits is able to temporarily increase the normal time delay of said first and second delay circuits respectively to such a value and during such a time period that the time interval between two successive state reversals of said bistate device is substantially at least equal to a second duration.

Still another characteristic feature of the present signalling circuit is that said second duration is substantially equal to said time period.

In accordance with a preferred embodiment of the invention the present signalling circuit includes two delay circuits able to react to positive and negtive level changes of two-level input pulses respectively, a bistable circuit which has inputs coupled to outputs of these delay circuits and which is triggered to a first and a second state when the corresponding delay circuit has reacted to a corresponding new level having a duration larger than a first duration, two monostable circuits having inputs coupled to respective outputs of the bistable circuit and outputs coupled to respective time constant modifying circuits. The latter circuits are coupled to respective ones of the delay circuits and are each able to modify the time delay of the associated delay circuit upon the associated monostable circuit having been operated. This happens when the bistable circuit has been triggered by the other delay circuit.

Figure 2:
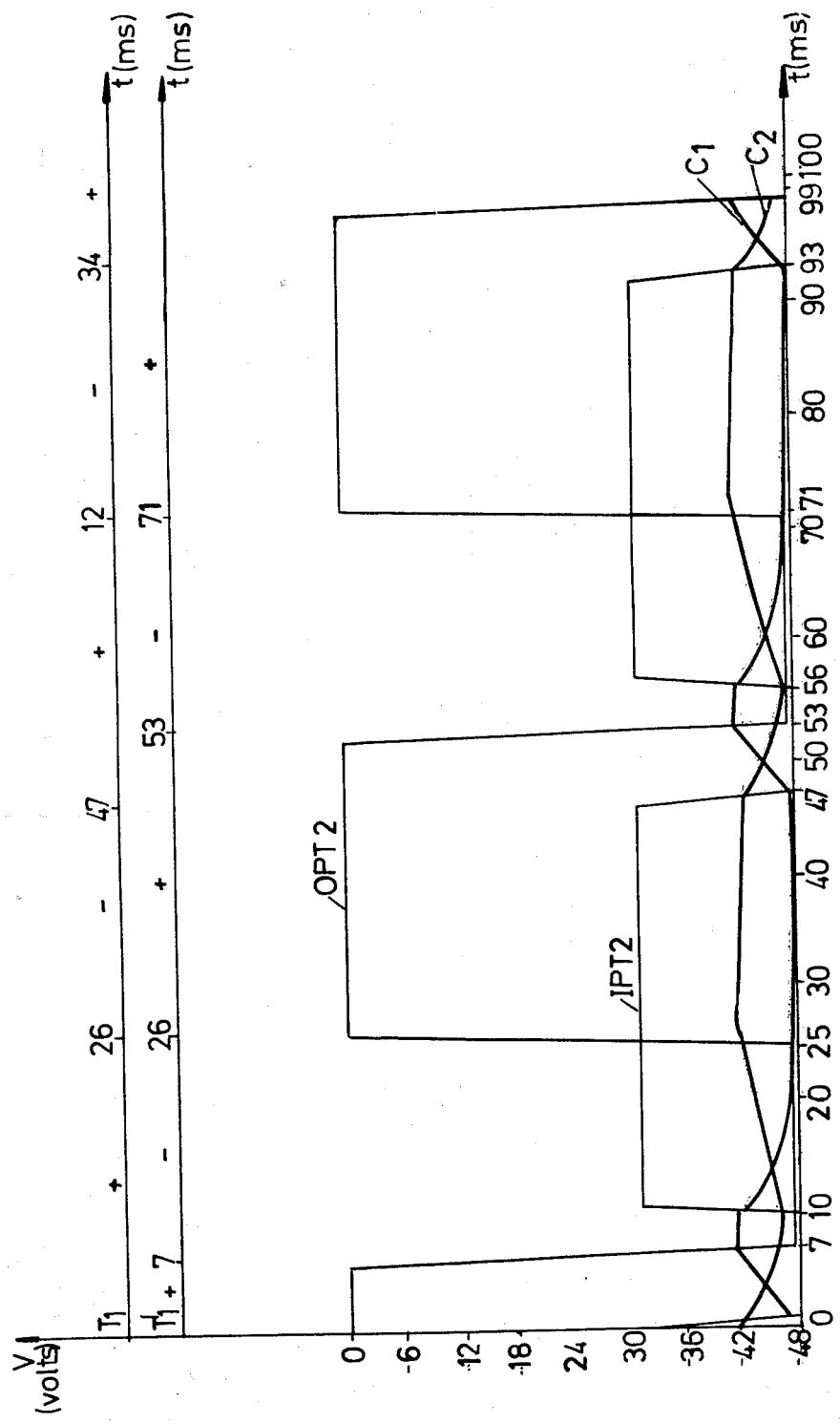
Figure 3:
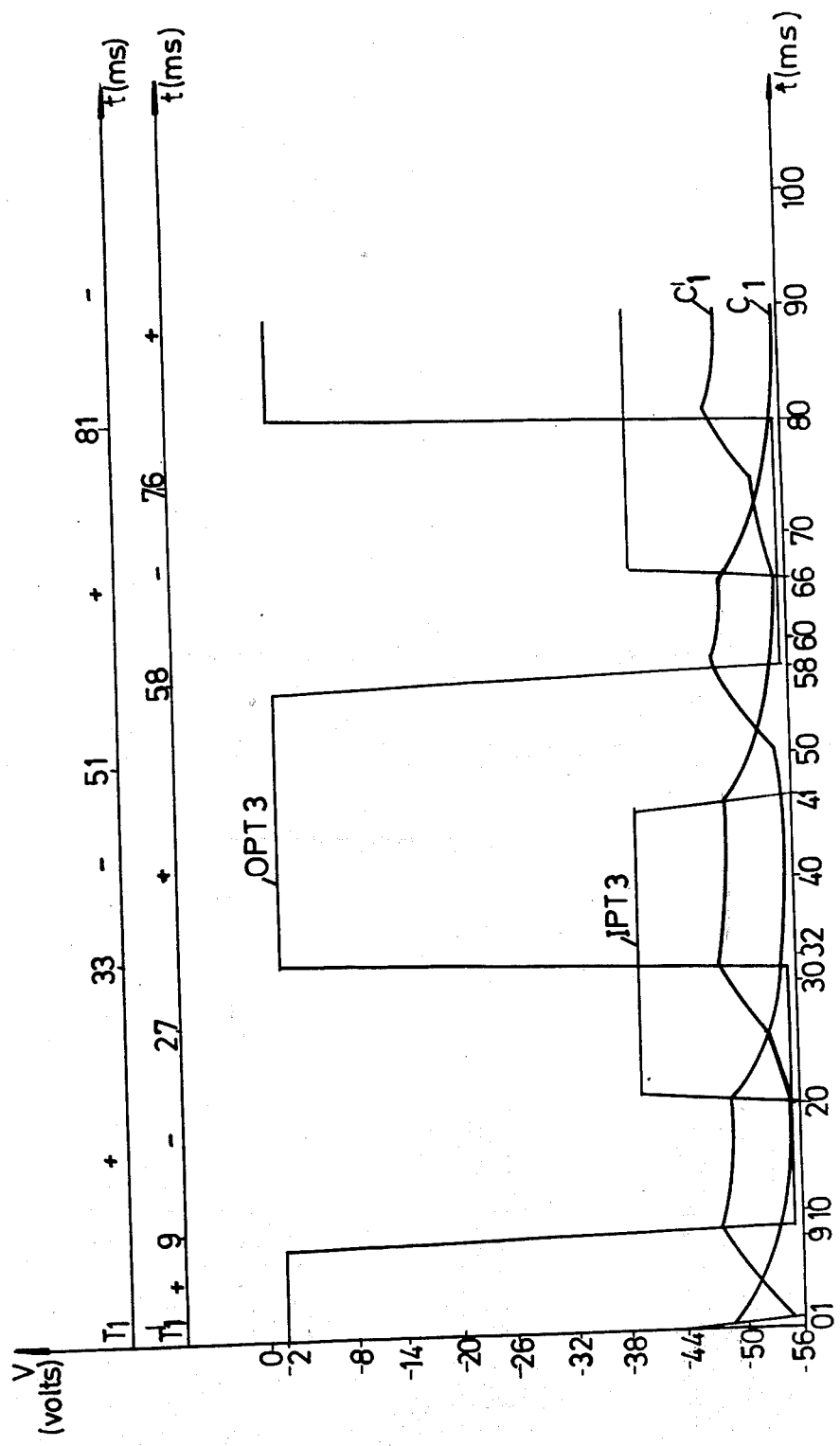
Figure 4:
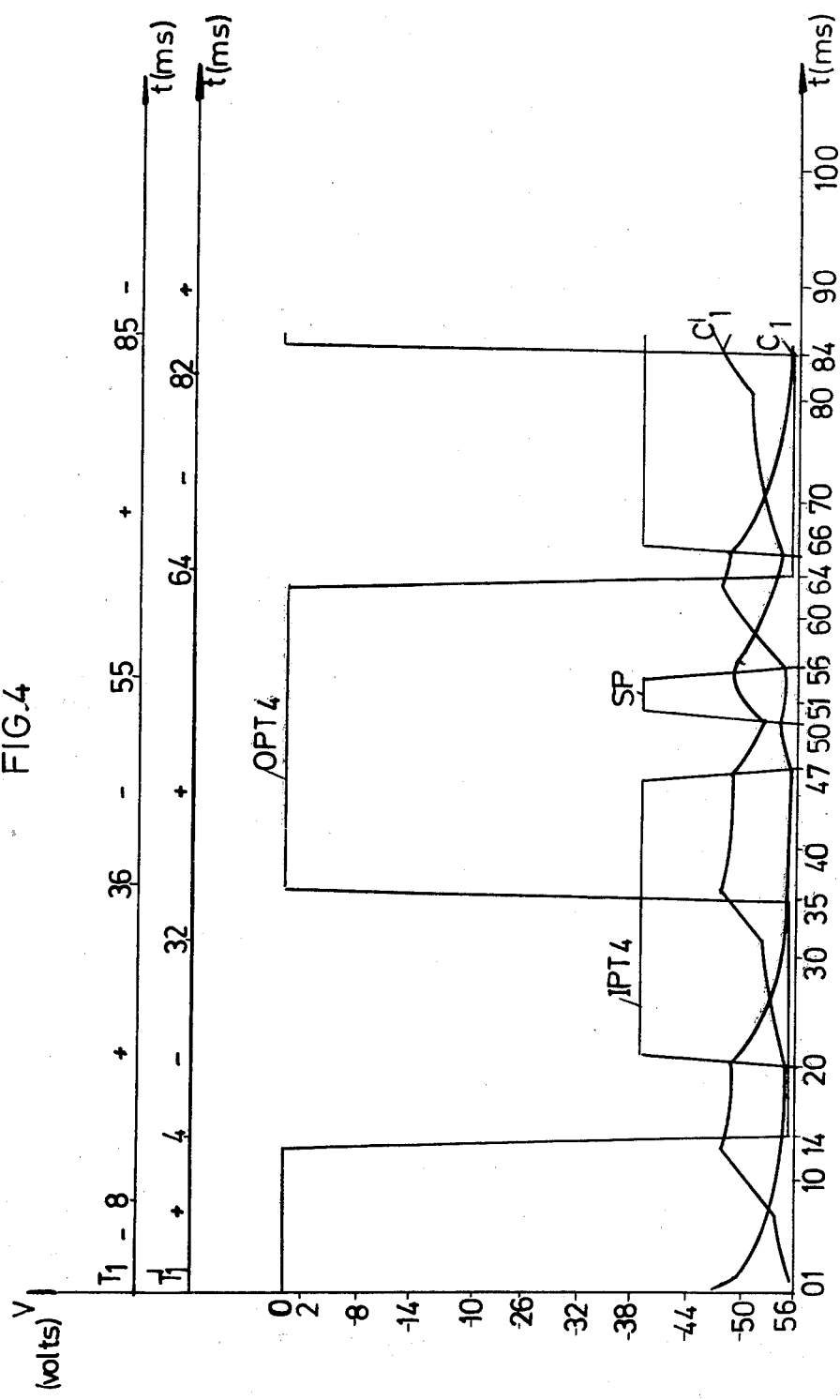

The above mentioned and other objects and features of the invention will become more apparent and the invention itself will be best understood by referring to the following description of an embodiment taken in conjunction with the accompanying drawings wherein:

FIG. 1 represents a two-level signalling circuit according to the present invention;

FIGS. 2, 3 and 4 show input pulse trains IPT2, IPT3 and IPT4 applied to the input terminal IN of the circuit of FIG. 1 and output pulse trains OPT2, OPT3 and OPT4 then appearing at the output terminal OUT of this circuit respectively, together with corresponding charge and discharge waveforms of the capacitors C1 anc C'1 and with the successive conditions indicated by plus and minus signs of the transistors T1 and T'1.

Principally referring to FIG. 1 the two-level signalling circuit shown therein has input terminal IN and output terminal OUT and includes PNP transistors T1 and T'1, NPN transistors T2, T'2, T3, T4 and T5, resistors R, R1 to R10, R'1 to R'6, R''7, R'''7, R'8 to R'10, and R11 to R16, capacitors C1, C'1, C2 and C'2, diodes $d1$, $d2$, $d3$, $d4$ and DC source B. The positive pole of this DC source is grounded and connected to busses BA and BB, whereas its negative pole or battery is connected to bus BC.

The parts DC1 and DC2 of the signalling circuit are substantially identical and therefore the constituent elements of DC2 are indicated by the same reference numerals as the homologous elements in DC1, however provided with an accent. The only difference between DC1 and DC2 is that the former includes resistor R7, while the latter includes the series connected resistors R''7 and R'''7, the sum of the resistance value of the latter resistors being however substantially equal to the resistance value of resistor R7.

Preferred values of these resistors and capacitors are as follows:

| | | | |
|---|---|---|---|
| R1 = R'1 = | 270 kilo-ohms | R9 = R'9 = | 100 kilo-ohms |
| R2 = R'2 = | 82 kilo-ohms | R10 = R'10 = | 150 kilo-ohms |
| R3 = R'3 = | 12 kilo-ohms | R11 = | 51 kilo-ohms |
| R4 = R'4 = | 56 kilo-ohms | R12 = | 12 kilo-ohms |
| R5 = R'5 = | 620 kilo-ohms | R13 = | 27 kilo-ohms |
| R6 = R'6 = | 27 kilo-ohms | R14 = | 120 kilo-ohms |
| R7 = | 47 kilo-ohms | R15 = | 51 kilo-ohms |
| R''7 = | 43 kilo-ohms | R16 = | 51 kilo-ohms |
| R'''7 = | 6.2 kilo-ohms | R = | 2.4 kilo-ohms |
| R8 = R'8 = 51 kilo-ohms | | | |
| C1 = C'1 = 0.47 micro-Farad | | | |
| C2 = C'2 = 0.0825 micro-Farad | | | |

The present signalling circuit includes:

- a first and a second delay circuit able to react to positive and negative input level changes of two-level input pulses respectively. These pulses are for instance telephone dial pulses;

- a bistable circuit which has inputs coupled to the out-puts of these first and second delay circuits and which is triggered to a first and second state when these first and second delay circuits have reacted to a corresponding new level having a predetermined minimum duration respectively; and

- a first and a second control circuit having inputs coupled to respective outputs of the bistable circuit and outputs coupled to the first and second delay circuits, these first and second control circuits being able to modify the time delay of the first and second delay circuit upon the bistable device having been triggered to the second and first state respectively.

The first delay circuit is constituted by a first capacitor charge and discharge circuit which includes the resistor R1, R2 and R3 which are connected between ground and battery in series with the capacitor C1. This circuit further includes the NPN transistor T3 the emitter of which is directly connected to battery and the base of which is connected on the one hand to battery via the resistor R12 and on the other hand to the input terminal IN via the resistor S13. The junction point P2 of the resistors R2 and R3 is connected to the collector of the transistor T3 via the diode $d3$. The output of this first capacitor charge and discharge circuit is formed by the junction point P3 of the resistor R3 and the capacitor C1.

The second delay circuit is constituted by a second capacitor charge and discharge circuit which includes the resistors R'1, R'2 and R'3 which are connected between ground and battery in series with the capacitor C'1. The circuit further includes the NPN transistor T4 the emitter of which is connected to the junction point P10 of the resistor R15 and the diode $d5$ which are connected in series between ground and battery. The base of the transistor T4 is connected to the junction point P11 of the resistors R11 and R14 which are connected between ground and battery, and to the collector of the transistor T3 through the diode $d4$. The collector of the transistor T4 is connected to the junction point P'2 of the resistors R'2 and R'3. The output of this second capacitor charge and discharge circuit is formed by the junction point P'3 of the resistor R'3 and the capacitor C'1.

The first control circuit includes a first time constant modifying circuit and a first monostable circuit. The first time constant modifying circuit is constituted by the PNP transistor T1 the emitter-to-collector connection of which is connected across the resistor R1 and the base of which is connected to the output P4 of the first monostable circuit. The latter circuit includes:

- a first potentiometer circuit which is branched between ground and battery and which includes the series connection of the resistor R4, the diode $d1$ and the resistor R5;
- a second potentiometer circuit which is also branched between ground and battery and which includes the series connection of the resistors R6 and R7, the tapping point P6 forming the input of the monostable circuit; and
- a series circuit including the resistor R8 and the capacitor C2 connected between the tapping points P5 and P6 of the first and second potentiometer circuits.

The second control circuit includes a second time constant modifying circuit which is completely identical to the first time constant modifying circuit and includes transistor T'1 and a second monostable circuit which has input P'6 and which only differs from the first monostable circuit in that it includes the two resistors R''7 and R''''7 instead of the resistor R7, the junction point of these resistors being indicated by P'9.

The outputs P3 and P'3 of the first and second delay circuits are connected to the first and second inputs P7 and P'7 of the above mentioned bistable circuit via the diodes $d2$ and $d'2$ respectively. These inputs P7 and P'7 are constituted by the bases of the transistors T2 and T'2. The base P7 of transistor T2 is connected to the like named tapping point P7 of the potentiometer formed by the resistors R'6, R9 and R10, while the base P'7 of transistor T'2 is likewise connected to the like named tapping point P'7 of the potentiometer formed by the resistor R6, R'9 and R'10. The omitters of the transistors T2 and T'2 are connected to battery via the common resistor R, while the collectors P6 and P'6 of these transistors T2 and T'2 which constitute the first and second outputs of the bistable circuit are connected to the like named inputs P6 and P'6 of the above mentioned first and second monostable circuits.

The output terminal OUT of the circuit is constituted by the collector of the NPN transistor T5 the emitter of which is connected to the junction point P10 of the resistor R15 and the diode $d5$. This collector is connected to ground via the resistor R16, whereas the base of this transistor T5 is connected to the junction point P'5 of the resistors R''7 and R''''7.

It should be noted that also the above transistors T3 and T4 together form a bistable circuit the input of which is constituted by the base of transistor T3, while its outputs are formed by the collectors of the transistors T3 and T4.

The operation of the above described signalling circuit is described hereinafter.

First reference is made to FIGS. 1 and 2. Hereby it is supposed that the DC source B is a 48 volts source and that a voltage of −31.2 volts is applied to the input terminal IN. In this case the transistors T1, T'1, T'1, T'2 and T2, T4, T5 are in the conductive and non-conductive condition respectively, while the capacitors C'1, C2, C'2 and C1 are charged and discharged respectively. The potentials measured at various points of the circuit are the following:

| | |
|---|---|
| P1 : − 0.1 Volt | P'1 : − 01. Volt |
| P2 : − 47.4 Volts | P'2 : − 37 Volts |
| P3 : − 47.4 Volts | P'3 : − 41.8 Volts |
| P4 : − 0.6 Volts | P'4 : − 0.6 Volts |
| P5 : − 1.2 Volts | P'5 : − 1.2 Volts |
| P6 : − 21.2 Volts | P'6 : − 43.0 Volts |
| P7 : − 45.0 Volts | P'7 : 42.4 Volts |
| P8 : − 43 Volts | |
| | P'9 : − 47.4 Volts |
| P10 : − 47.4 Volts | |
| P11 : − 47.4 Volts | |
| OUT : 0 Volts | |

FIG. 2 shows a two-level input pulse train IPT2 varying between − 31.2 and −48 Volts and constituted by a plurality of successive negative and positive going pulses having a period of 46 milliseconds and a duration of 10 milliseconds and 36 milliseconds respectively. This period is supposed to be the minimum period of the input pulse trains which may be applied to the input terminal IN. When this input pulse train is applied to this input terminal IN of the circuit the transistor T3 blocks at each lower level (−48 Volts) of this train, whereas it becomes conductive at each upper level (− 31.2 Volts) thereof.

After the first negative going edge of the input pulse train IPT2 has been applied to the input terminal IN, i.e., after $t = 1$ milliseconds, the transistor T3 becomes non-conductive so that the diode $d4$ blocks and that consequently transistor T4 becomes conductive by the −33 Volts potential then applied to its base. In other words, the bistable circuit T3, T4 is counterbalanced. Due to this the capacitor C'1 discharges from − 41.8

Volts towards battery in the following circuit: battery, capacitor C'1, resistor R'3, collector-to-emitter connection of conductive transistor T4, diode d5, battery.

As soon as transistor T3 is non-conductive the capacitor C1 starts charging relatively rapidly with a calculated time constant (independent from the large resistance R1) of about 44 msec from $-47.4$ Volts towards ground in the following ciruit: ground, resistor R1 in parallel with the emitter-to-collector connection of conductive transistor T1, resistors R2 and R3, capacitor C1, battery. Since the cathode P7 of the diode $d2$ initially is at $-45$ Volts this diode is blocked as long as the charge on capacitor C1, i.e., at the output P3 of the first capacitor charge and discharge circuit R1, R2, R3, C1, is below that at the cathode of this diode. However, as soon as this voltage is reached the diode $d2$ becomes conductive so that current is then able to flow from this output P3 to the first input P7 of the above bistable circuit T2, T'2. From that amount on the capacitor C1 charges relatively rapidly towards about $-25$ Volts with a calculated time constant (also independent of R1) of about 17 milliseconds (not visible on FIG. 2 since the slopes of both charge curve portions are substantially the same). consequently, also the potential of the first input P8 of the bistable circuit gradually increases and at $t = 6$ milliseconds it becomes equal to the potential of the emitter P8 of the transistor T2 due to which this transistor starts becoming conductive. Hereby the potential at the first output P6 and at the second input P'7 of this bistable circuit both decrease. The negative voltage step thus produced at the first output P6 appears at the tapping point P5 and maintains the diode $d1$ in its conductive condition. Hence, the output P4 of the first monostable circuit remains deactivated. However, due to the decrease of the potential at the second input P'7 the transistor T'2 becomes non-conductive, the bistable circuit T2, T'2 being thus counterbalanced. Consequently the potential at the second output P'6 of this bistable circuit T2, T'2 and at the like named input of the second monostable circuit increases. This positive going voltage step appears at the tapping point P'5 of the potentiometer R'4, $d'1$, R'5 due to which the diode $d'1$ is blocked temporarily until the capacitor C'2 has charged to such a value that the potential at the tapping point P'5 is again sufficiently low to make the diode $d'1$ conductive. During the time the diode $d'1$ is temporarily blocked the output P'4 of the second monostable circuit and the like named input of the second time constant modifying circuit constituted by the transistor T'1 are temporarily activated. Consequently, the latter transistor T'1 becomes non-conductive for a time period of about 20 milliseconds (measured 19 milliseconds). As indicated on FIG. 2 this time period starts at $t = 7$ milliseconds and ends at $t = 26$ milliseconds. Due to the transistor T'1 being non-conductive the relatively large resistance R'1 of the second capacitor charge and discharge circuit is no longer short-circuited so that the time constant of this circuit is considerably increased.

When the transistor T'2 becomes non-conductive also the potential at the tapping point P'9 of the potentiometer R'6, R''7, R''''7 increases due to which the transistor T5 becomes fully conductive so that the potential at the output terminal OUT becomes equal to about $-47.4$ Volts. From FIG. 2 follows that this happens at $t = 7$ milliseconds. Hence, the lower end of the first negative going edge of the output pulse train OPT2 is delayed with respect to the corresponding end of the first negative going edge of the input pulse train IPT2 by a normal time delay of about 15 milliseconds.

After the first negative going edge of the output pulse train OPT2 has appeared at the output terminal OUT, i.e., from $t = 7$ milliseconds on, the charge of capacitor C1 remains substantially constant, while the capacitor C'1 continues discharging as indicated in FIG. 2.

Upon the first positive going edge of the input pulse train IPT2 being applied to the input terminal IN, i.e., at $t - 10$ milliseconds, the transistor T3 starts becoming conductive so that the diodes $d3$ and $d4$ both become conductive due to which:
- the capacitor C1 discharges from a measured voltage of about $-41.4$ Volts towards battery in the following circuit: battery, capacitor $c1$, resistor R3, diode d3, collector-to-emitter connection of transistor Te, battery;
- the transistor T4 blocks due to the fact that the potential of its base decreases as current now flows from ground to battery via resistor R14, diode d14 and the collector-to-emitter connection of transistor T3. In other words, the bistable circuit T3, T4 is counterbalanced.

Due to the transistor T4 being blocked and the transistor T'1 being also non-conductive the capacitor C'1 charges relatively slowly with a calculated time constant (dependent on the large resistance R1) of about 171 milliseconds from about $-46.4$ Volts towards ground in the following circuit: ground, resistors R'1, R'2, R'3, capacitor C'1, battery. Since the cathode P'7 of the diode $d'2$ is at $-45$ Volts this diode is blocked as long as the charge on capacitor C'1, i.e., at the output P'3 of the second capacitor charge and discharge circuit R'1, R'2, R'3, C'1, is below that at the cathode of this diode. However, as soon as this voltage is reached, the diode $d'2$ becomes conductive so that current is then able to flow from this output P'3 to the second input P'7 of the bistable circuit T2, T'2. From that moment on the capacitor C'1 charges relatively slowly towards about $-39$ Volts with a calculated time constant (dependent of R'1) of about 24 milliseconds (not visible on FIG. 2 since the slopes of both charge curve portions are substantially the same). Consequently, also the potential of the second input P'7 of the bistable circuit T2, T'2 gradually increases and at $t= 25$ milliseconds it becomes equal to the potential of the emitter P'8 of the transistor T2 due to which this transistor T'2 becomes conductive. Hereby the potential at the second output P'6 and at the second input P7 of this bistable circuit T2 both decrease. The negative voltage step thus produced at the output P'6 appears at the tapping point P'5 and maintains the diode $d'1$ in its conductive condition. Hence, the output P'4 of the second monostable circuit remains deactivated. However, due to the decrease of the potential at the input P7 the transistor T2 becomes non-conductive, the bistable circuit T2, T'2 being thus counterbalanced. Consequently, the potential at the first output P6 of the bistable circuit T2, T'2 and at the like named input of the first monostable circuit increases. This positive going voltage step appears at the tapping point P5 of the potentiometer R4, $d1$, R5 due to which the diode $d1$ is blocked temporarily until the capacitor C2 has charged to such a value that the potential at the tapping point P5 is again sufficiently low to make the diode $d1$ conductive. During the time the diode $d1$ is temporarily blocked the output P4 of the first monostable circuit and the like named input of the first time constant modifying circuit constituted by the transistor T1 are temporarily deactivated. Consequently the latter transistor T1 becomes non-conductive for a time period of about 20 milliseconds (measured 21 milliseconds). As indicated in FIG. 2 this time period starts at $t = 26$ milliseconds and ends at $t = 47$ milliseconds. Due to the transistor T1 being non-conductive the relatively large resistance R'1 of the first capacitor charge and discharge circuit is no longer short-circuited so that the time constant of this circuit is considerably increased.

When the transistor T'2 becomes conductive also the potential at the tapping point P'9 of the potentiometer R'6, R''7, R''''7 decreases due to which the transistor T5 becomes fully non-conductive so that the potential at the output terminal OUT becomes equal to about 0 Volts. From FIG. 2 follows that this happens at $t = 26$ milliseconds. Hence the lower end of the first positive going edge of the output pulse train OPT2 is delayed with respect to the corresponding end of the first positive going edge of the input pulse train OPT2 by an increased time delay of about 15 milliseconds.

After the first positive going edge of the output pulse train OPT2 has appeared at the output terminal OUT, i.e., from $t = 26$ milliseconds on, the charges on the capacitors C1 and C'1 evoluate as indicated on FIG. 2.

After the occurrence of the second negative going edge at $t = 47$ milliseconds of the input pulse train OPT2 the capacitors C1 and C'1 substantially have gained the same charge ($- 47.3$ Volts and $- 42$ Volts respectively) as at the occurrence of the first negative going edge of this pulse train, while also both the transistors T1 and T'1 are conductive. Therefore this second negative going edge is delayed in an analogous way as described above for the first negative going edge of IPT2. The same is true for the first and second positive going edges, etc.

The resultant output pulse train OPT2 has the same period (46 milliseconds) as the input pulse train IPT2. The 10 milliseconds negative pulses of IPT2 appear in the OPT2 as 19 milliseconds negative pulses, whereas the 36 milliseconds positive pulses of IPT2 appear in the OPT2 as 27 milliseconds positive pulses.

Reference is now made to FIG. 3. Hereby it is supposed that the DC source B is a 56 Volts source and that a voltage of $- 31.2$ Volts is applied to the input terminal IN. In this case the transistors T1, T3, T'1, T'2 and T2, T4 are in the conductive and non-conductive condition respectively, while the capacitors C'1, C2, C'2 and C1 are charged and discharged respectively. The potentials measured at various points of the circuit are the following:

| | |
|---|---|
| P1 : $- 0.1$ Volt | P'1 : $- 0.1$ Volt |
| P2 : $- 55.4$ Volts | P'2 : $- 42.7$ Volts |
| P3 : $- 55.4$ Volts | P'3 : $- 49$ Volts |
| P4 : $- 0.6$ Volt | P'4 : $- 0.6$ Volt |
| P5 : $- 1.2$ Volts | P'5 : $- 1.2$ Volts |
| P6 : $- 24.7$ Volts | P'6 : $- 50.2$ Volts |
| P7 : $- 52.5$ Volts | P'7 : 49.6 Volts |
| P8 : $- 50.2$ Volts | |
| | P'9 : $- 55.3$ Volts |
| P10 : $- 55.4$ Volts | |
| P11 : $- 55.4$ Volts | |
| OUT : 0. Volt | |

FIG. 3 shows a two-level input pulse train IPT3 (FIG. 3) varying between $- 31.2$ and $- 56$ Volts and constituted by a plurality of successive negative and positive going pulses having a period of about 46 milliseconds and a duration of about 20 milliseconds and about 26 milliseconds respectively. When this input pulse train is applied to the input terminal IN of the circuit the transistor T3 blocks at each lower level ($- 56$ Volts) of this train, whereas it becomes conductive at each upper level ($- 31.2$ Volts) thereof. The first negative going edge of the input pulse train IPT3 is delayed by a normal time delay of about 9 milliseconds in an analogous way (but with different time constants) as described above in relation with FIG. 2 since the transistor T1 is then conductive, and when the corresponding first negative going edge of the output pulse train OPT3 appears at the output terminal OUT, i.e. at $t - 9$ milliseconds, the transistor T'1 is blocked for a time period of about 18 milliseconds, as shown. Upon the first positive going edge of the input pulse train IPT3 being applied to the input terminal IN the bistable circuit T3, T4 is counterbalanced and since this edge occurs within the above 18 milliseconds time period, the capacitor C'1 starts charging relatively slowly, in an analogous way as described above for the first positive going edge in relation with FIG. 3. However, during this charge operation and more particularly at $t = 27$ milliseconds the transistor T1' becomes fully conductive so that the slope of the charge curve of capacitor C'1 then suddenly considerably increases as the charge time constant becomes independent from R'1. At $t = 32$ milliseconds the charge on capacitor C'1 reaches such a value that transistor T'2 starts becoming conductive due to which at $t = 33$ milliseconds transistor T5 is fully blocked and the first positive going edge of the output pulse train OPT3 appears at the output terminal OUT. From FIG. 3 follows that the lower end of the first positive edge of the output pulse train OPT3 thus is delayed by an increased time delay of about 12 milliseconds with respect to the corresponding end of the first positive edge of the input pulse train IPT3.

From the same FIG. 3 it appears that the second negative going edge of the input pulse train IPT3 which ends at $t = 47$ milliseconds is delayed during 4 to 5 milliseconds by a time interval depending on the relatively large resistance R1 since the transistor T1 is blocked and from then on by a time interval which is dependent from the resistor R1 since the transistor T1 then becomes conductive. The lower end of second negative going edge of the output pulse train OPT2 is thus delayed by an increased time delay of about 11 milliseconds with respect to the corresponding second negative going edge of the input pulse train IPT3.

The second positive going edge of the input pulse train IPT3 is delayed in an analogous way as the first positive going edge of this pulse train, etc.

From the above follows that each time the bistable circuit T2, T'2 is counterbalanced due to a new input level of at least a minimum duration (6 ms in FIG. 2; 8 ms in FIG. 3) having been applied to a capacitor charge and discharge circuit the time constant of the other capacitor charge and discharge circuit, i.e., of the one which will start charging its capacitor upon the next following input level being applied to it, is temporarily increased for a predetermined time period. This time period has been so chosen that if a capacitor C1 or C'1 is charged with the increased time constant during this whole time period the bistable circuit is counterbalanced substantially at the end of this time period. By this choice one is sure that the duration of each output pulse, i.e., the time interval between two successive output edges is substantially equal or larger than this time period.

Indeed:

- each positive or negative going input edge occurring outside an above mentioned time period during which the corresponding transistor T1 or T'1 is blocked is delayed with a normal time delay slightly larger than the above minimum duration so that it obviously also appears as an output edge outside this period. Hence, the output pulse of which this output edge forms part necessarily has a duration larger than this time period;

- each positive or negative going input edge occurring inside an above time period during which the corresponding transistor T1 or T'1 is blocked is delayed with an increased time delay (due to the increased time constant) during the remaining time portion of this period. Since this time portion is insufficient to charge the capacitor C1 or C'1 to such a value that the bistable circuit T2, T'2 is triggered, as assumed above, the charging continues outside the time period. Therefore, the duration of the finally obtained output pulse is necessarily larger than this time period.

It should be noted that the preferred value of the time period is equal to half the difference of the minimum period of the input level changes, i.e., about 46 milliseconds, and the normal time delay. For instance, in FIG. 2 the time period is substantially equal to 20 milliseconds due to the normal time delay being substantially equal to 5 milliseconds.

From the above also follows that an input pulse train wherein the durations of the constituent positive and negative pulse are considerably different (such as is particularly the case in FIG. 2) is transformed into an output pulse train wherein these durations tend towards each other, the ideal being square output pulses. This enables the obtained output pulses to be much more easily detected than the input pulses.

In case the input pulses are sufficiently long the above transformation is obviously no longer required and is also not performed by the present circuit. Indeed, if the duration of the pulses of the input pulse train is so large that each positive or negative going input pulse edge occurs outside a time period wherein the corresponding transistor T1 or T'1 is not conductive, this edge will be delayed by the normal time delay. Hence, an output pulse train which is the exact replica of the input pulse train, however delayed by about the normal time delay, will appear at the output OUT of the circuit.

Principally referring to FIG. 4 of the input and output pulse trains IPT4 and OPT4 shown therein are in fact continuations of the pulse trains IPT3 and OPT3 shown in FIG. 3. The input pulse train IPT3 includes a spurious pulse SP formed by two edges which follow one another at about 5 milliseconds, measured at the lower ends of these edges.

At the moment of occurrence of the first negative going edge of IPT4 the transistor T1 is in the blocked condition until $t = 8$ milliseconds so that until this moment this edge is delayed by an increased time delay and afterwards by the normal time delay. Consequently the lower end of the first negative going edge of OPT4 appears 13 milliseconds after the time of occurrence of the corresponding end of the first negative going edge. In an analogous way the lower end of the first positive going end of OPT4 appears 15 milliseconds after the corresponding end of the first positive going end of IPT4. This means that the 19 milliseconds first negative going input pulse appears as a 21 milliseconds output pulse at the output terminal OUT of the circuit.

The second negative going edge of the input pulse train IPT3 appears at $t = 47$ milliseconds within the 19 milliseconds time interval, delimited by $t - 36$ ms at $t = 55$ ms, during which the transistor T1 is blocked so that from $t - 47$ milliseconds on the capacitor C1 starts charging with a relative large time constant dependent on resistor R1, while the capacitor C'1 starts discharging. However, before the charge on the capacitor C1 has reached a value sufficient to make transistor T2 and therefore transistor T5 conductive the positive going edge of the spurious pulse SP appears at the input terminal IN. Consequently, the charging of the capacitor C1 is interrupted as this capacitor C1 now starts discharging, while the capacitor C'1 starts charging with a relatively small time constant since the transistor T;1 is conductive at that moment, as shown on FIG. 4. This operation continues until the occurrence of the negative going edge of the spurious pulse SP. This circuit has been so calculated that if the duration of this pulse SP is smaller than the above normal time delay and if the time interval between the positive going edge of SP and the immediately preceding negative going edge is such as to prevent the latter edge to appear at the output terminal OUT, the charge on the capacitor C'1 never reaches the trigger value of the transistor T'2 and of the transistor T5 before the negative going edge of the spurious pulse SP occurs. therefore, at the moment of occurrence of the latter edge the capacitor C1 and C'1 again start charging and discharging respectively until the trigger value of the transistor T'2 is reached. The transistor T5 then becomes conductive so that a negative going pulse edge then appears at the output terminal OUT of the circuit, as shown.

From the above follows that any spurious pulse SP having a duration smaller than the normal time delay is prevented to appear at the output terminal OUT of the circuit.

While the principles of the invention have been described above in connection with specific apparatus, it is to be clearly understood that this description is made only by way of an example and not as a limitation on the scope of the invention.

I claim:

1. A pulse correcting circuit including a first and a second delay circuit responsive to input voltage level changes from a two-level input network, a bistate circuit coupled to said first and second delay circuits, said first and second delay circuits causing the triggering of said bistate circuit to a first and a second state respectively responsive to an input pulse voltage level change at least continuing for a first duration, wherein there is a first and a second control circuit coupled to said bistate circuit, said control circuits also being coupled to said first and second delay circuits respectively for increasing the time delay of respective first and second delay circuits responsive to said bistate circuit having been triggered to said second and first state respectively for a minimum predetermined time interval.

2. A pulse correcting circuit according to claim 1, wherein each of said delay circuits has a normal delay duration at least equal to said first duration, each of said first and second control circuits has means for temporarily increasing the normal time delay of said first and second delay circuits respectively to set the time interval between two successive state reversals of said bistate device at an interval at least equal to a second duration.

3. A pulse-correcting circuit according to claim 1, wherein said first control circuit includes a first time constant modifying circuit to modify the time delay of said first delay circuit and a first monostable circuit the output of which is coupled to said first time-constant modifying circuit and the input of which is coupled to a first output of said bistate circuit.

4. A pulse-correcting circuit according to claim 3, wherein said second control circuit includes a second time-constant modifying circuit to modify the time delay of said second delay circuit and a second monostable circuit the output of which is coupled to said second time-constant modifying circuit and the input of which is coupled to a second output of said bistate circuit.

5. A pulse correcting circuit according to claim 4, wherein each of said monostable circuits includes a first and a second potentiometer circuit, respective first and second tapping points of which are intercoupled via a capacitor, said first potentiometer circuit including a series first diode having a first electrode which is connected to said first tapping point and a second electrode which is connected to the base of a first transistor switch which constitutes said time constant modifying circuit and which has an emitter-to-collector circuit coupled across a resistance of a corresponding capacitor charge and discharge circuit forming a said delay circuit, said second electrode and said second tapping point constituting said output and said input of said monostable circuit respectively.

6. A pulse correcting circuit according to claim 1, characterized in that each of said first and second delay circuits includes a first and a second capacitor charge and discharge circuit which is able to charge and discharge the capacitor thereof when a positive and negative level change is applied to its input respectively, the capacitor of said first capacitor charge and discharge circuit being charged when the capacitor of said second capacitor charge and discharge circuit is being discharged respectively and vice-versa.

7. A pulse correcting circuit according to claim 6, wherein each of said capacitor charge and discharge circuits includes the series connection between the poles of a DC source of a first resistance, a second resistance, a third resistance and a capacitor, the junction point of said third resistance and said capacitor forming said output of said capacitor charge and discharge circuit, and a second transistor switch the collector-to-emitter circuit of which is coupled in series with a diode across the series connection of said third resistance and said capacitor and that the second transistor switches of said first and second capacitor charge and discharge circuits are interconnected so as to form said second bistate device.

8. A pulse correcting circuit according to claim 7, wherein first bistate device includes two third transistor switches, the emitter-to-collector circuits of each of which are each connected in series with a common fourth resistance across a fifth resistance of a corresponding one of said second potentiometer circuits which further comprises a sixth resistance and that the base of each of said third transistor switches is connected to the junction point of a seventh at an eighth resistance which are connected in series with the sixth resistance of the other one of said second potentiometer circuits.

9. A pulse correcting circuit receptive of two-condition input pulses of varying duration with each pulse condition comprising a condition having a difference from the voltage of the other condition of greater than a predetermined amount, a first and second delay circuit coupled to receive pulses from said input circuit and to respond to respective pulses representing the respective conditions, with both said delay circuits having essentially the same time interval, a bistate output circuit, a first portion of said bistate circuit coupled to respond to the output of said first delay circuit and a second portion of said bistate circuit coupled to respond to the output of said second delay circuit, a time modifying circuit for said first delay circuit and a second time modifying circuit for said second delay circuits, said time modifying circuits operative responsive to an input pulse of duration greater than a minimum interval for increasing the duration of pulses to the respective bistable circuits accordingly.

10. A pulse correcting circuit as claimed in claim 9, wherein said first and second portions of said bistate circuit comprise monostable circuits.

* * * * *